US006548869B2

(12) United States Patent
Brewer et al.

(10) Patent No.: US 6,548,869 B2
(45) Date of Patent: Apr. 15, 2003

(54) VOLTAGE LIMITING PROTECTION FOR HIGH FREQUENCY POWER DEVICE

(75) Inventors: Kenneth P. Brewer, Mountain View, CA (US); Howard D. Bartlow, Nampa, ID (US); Johan A. Darmawan, Santa Clara, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 0 days.

(21) Appl. No.: 09/905,294

(22) Filed: Jul. 13, 2001

(65) Prior Publication Data

US 2003/0011031 A1 Jan. 16, 2003

(51) Int. Cl.[7] .................................................. H02H 9/00
(52) U.S. Cl. ........................ 257/355; 257/356; 257/296
(58) Field of Search ........................ 361/56, 91.1, 91.5, 361/111, 156; 257/173, 174, 177, 296, 724, 924, 355, 356

(56) References Cited

U.S. PATENT DOCUMENTS 4,758,873 A * 7/1988 Monticelli et al. .......... 257/296
5,617,282 A * 4/1997 Rall et al. ..................... 361/56

* cited by examiner

Primary Examiner—Minh Loan Tran
Assistant Examiner—Thomas L Dickey
(74) Attorney, Agent, or Firm—Townsend and Townsend and Crew LLP; Henry K. Woodward

(57) ABSTRACT

An RF power device comprising a power transistor fabricated in a first semiconductor chip and a MOSCAP type structure fabricated in a second semiconductor chip. A voltage limiting device is provided for protecting the power transistor from input voltage spikes and is preferably fabricated in the semiconductor chip along with the MOSCAP. Alternatively, the voltage limiting device can be a discrete element fabricated on or adjacent to the capacitor semiconductor chip. By removing the voltage limiting device from the power transistor chip, fabrication and testing of the voltage limiting device is enhanced, and semiconductor area for the power device is increased and aids in flexibility of device fabrication.

12 Claims, 1 Drawing Sheet

VOLTAGE LIMITING PROTECTION FOR HIGH FREQUENCY POWER DEVICE

BACKGROUND OF THE INVENTION

This invention relates generally to high-power electrical devices, and more particularly the invention relates to voltage limiting and electrostatic discharge protection in a semiconductor power device.

Power semiconductor devices such as MESFETs or bipolar transistors which operate at high frequencies typically are connected to capacitive devices such as discrete MOSCAPs for input frequency and impedance matching. The discrete MOSCAP devices are mounted in a semiconductor package along with the semiconductor transistor chip and are interconnected therewith by suitable means such as wire bonding.

The power device must be protected against an input voltage overload which could damage or destroy the device. Heretofore, a voltage limiting or electrostatic discharge device (ESD) such as a zener diode, avalanche diode, or transistor has been integrated into the power transistor chip or power integrated circuit chip. While this integration of components on the power chip is readily accomplished in the fabrication process, use of the power chip for the ESD device is costly in loss of power chip space. Further, size and flexibility of the electrostatic discharge device along with ability to test the electrostatic discharge device and/or the transistor separately are compromised.

The present invention is directed to overcoming these limitations in prior art power device structures.

BRIEF SUMMARY OF THE INVENTION

In accordance with the invention, a power transistor device for high frequency applications includes a power transistor in a first discrete semiconductor chip, a capacitor and a voltage limiting device in a second discrete semiconductor chip, and a package for receiving and sealing the first and second semiconductor chips. Electrical connectors connect the capacitor and voltage limiting device in the second chip to the power transistor in the first chip.

In preferred embodiments of the invention, the voltage limiting device comprises a diode or transistor and the capacitor is a MOSCAP which are connected in parallel. Since the MOSCAP chip has ample space for fabricating the voltage limiting or ESD device, increased space is available in the semiconductor chip for the power transistor thus allowing greater flexibility in the power device fabrication.

The invention and objects and features thereof will be more readily apparent from the following detailed description and dependent claims when taken with the drawing.

BRIEF DESCRIPTION OF THE DRAWINGS

Like elements in the drawings have the same reference numerals.

DETAILED DESCRIPTION OF ILLUSTRATED EMBODIMENTS

Figure 1A:
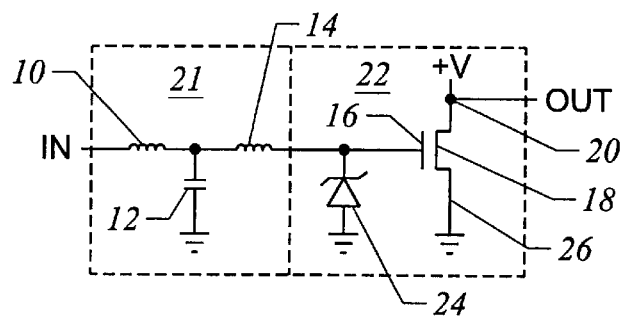
FIGS. 1A and 1B are an electrical schematic and a plan view of a physical structure of a packaged power transistor in accordance with the prior art.
Figure 1B:
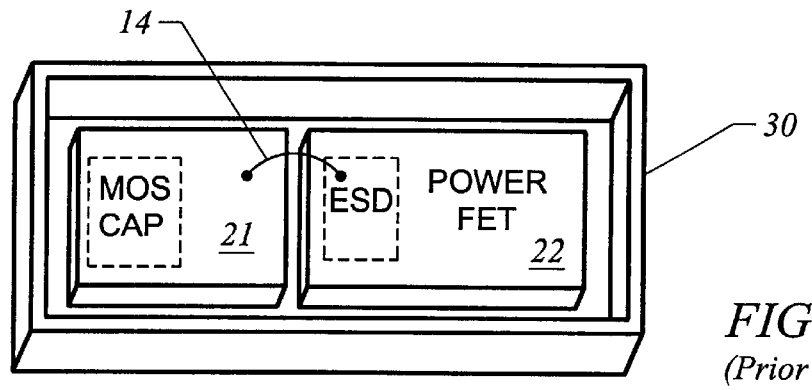

FIGS. 1A and 1B are an electrical schematic and a plan view of a physical layout of an RF power transistor in accordance with the prior art. As shown in FIG. 1A, the RF input to the power device is applied through an inductive element 10 which may be wire bonding and a shunt capacitor 12 which are in a first chip 21. The input signal is then applied through wire bonding 14 to the gate 16 of a power transistor such as a lateral DMOS transistor 18 in a second chip 22. The power output is taken at the drain 20 of transistor 18, while a voltage limiting device such as zener diode 24 is connected between gate 16 and source 26 of power transistor 18 to protect the transistor against voltage spikes on the input. As shown in FIG. 1B, chip 21 and chip 22 are mounted in a semiconductor package 30 with the wire bonding 14 interconnecting the capacitor in chip 21 to the ESD device 24 and power transistor 18.

As noted above, provision for the electrostatic discharge device 24 in the chip with the power transistor 18 facilitates fabrication of the structures, but the ESD device occupies valuable semiconductor chip area and limits flexibility and size of the power transistor. Further, testing of the voltage limiting device is more difficult since the device is interconnected with the power transistor during fabrication.

In accordance with the present invention, placement of the voltage limiting device on the capacitor chip facilitates flexibility and testing of the voltage limiting device while imposing few limits in chip area, process flow, and structure. Thus, cost is reduced, and the voltage limiting structure can be tested separately from both the transistor and capacitor structures.

Figure 2A:
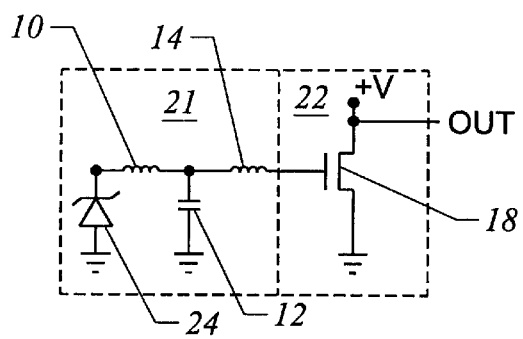
FIGS. 2A, 2B are an electrical schematic and a plan view of a physical layout of a power transistor device in accordance with one embodiment of the present invention.
Figure 2B:
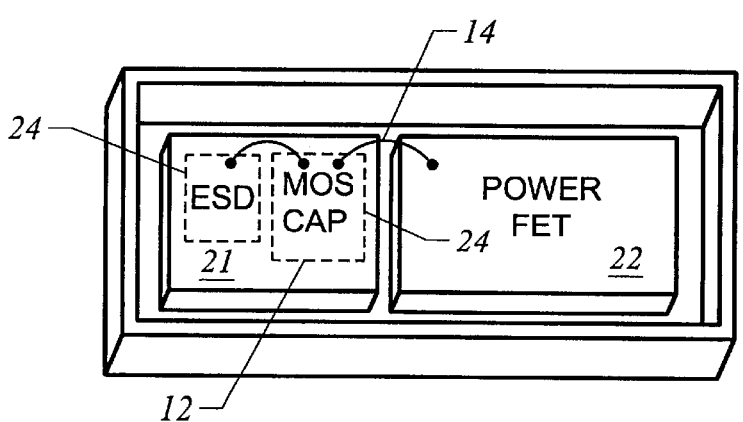

In FIGS. 2A and 2B, ESD device 24 is placed on chip 21 with wire bonding 10 connecting MOSCAP 12 with ESD device 24, and wire bonding 14 connecting MOSCAP 12 to the power FET in chip 22.

Figure 3:
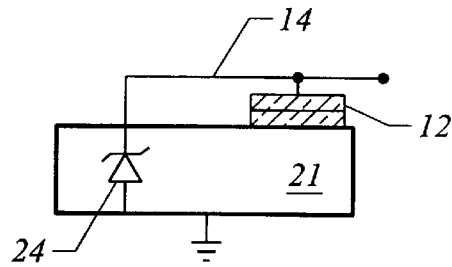
FIG. 3 is a side view in section of a MOSCAP and diode in accordance with one embodiment of the invention.

FIG. 3 is a side view in section illustrating MOSCAP 12 formed on the surface of chip 21 with the voltage limiting device such as diode 24 fabricated in chip 21. The electrical characteristics of diode 24 can be readily tested prior to interconnecting the diode with MOSCAP 12 through wire bonding 14. Again, diode 24 can be a zener or avalanche diode or a voltage limiting transistor structure.

The power transistor in accordance with the present invention removes limits imposed on the power transistor chip and provides flexibility in testing and use of the voltage limiting device. Cost of the power transistor die is reduced and has greater flexibility in transistor layout. While the invention has been described with reference to specific embodiments, the description is illustrative of the invention and is not be construed as limiting the invention. For example, while the preferred embodiment includes the ESD device in the MOSCAP semiconductor die, separate discrete ESD or voltage limiting devices could be mounted in the transistor package along with the MOSCAP and power FET dies. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A power transistor device for high frequency applications comprising:
   a) a power transistor in a first discrete semiconductor chip;
   b) a capacitor in a second discrete semiconductor chip;
   c) a voltage limiting device fabricated in the second discrete semiconductor chip along with the capacitor;

d) a package for receiving and sealing the power transistor, capacitor, and voltage limiting device; and e) electrical connectors connecting the capacitor and voltage limiting device to the power transistor.

2. The power transistor device as defined by claim 1, wherein the voltage limiting device comprises a transistor.

3. The power transistor device as defined by claim 1, wherein the voltage limiting device comprises a diode.

4. The power transistor device as defined by claim 1, wherein the electrical connectors comprise wire bonding.

5. The power transistor device as defined by claim 1, wherein the capacitor is a MOSCAP or other capacitor structure.

6. The power transistor device as defined by claim 5, wherein the voltage limiting device comprises a diode.

7. The power transistor device as defined by claim 6, wherein the electrical connector comprises wire bonding.

8. For use with a semiconductor power transistor fabricated in a first discrete semiconductor chip, a capacitor structure comprising a second discrete semiconductor chip, a capacitive element fabricated in the second discrete semiconductor chip, and a voltage limiting device fabricated in the second discrete semiconductor chip and connectable in parallel with the capacitor structure.

9. The capacitor structure as defined by claim 8, wherein the voltage limiting device comprises a diode.

10. The capacitor structure as defined by claim 8, wherein the voltage limiting device comprises a transistor.

11. The capacitor structure as defined by claim 8, and including wire bonding for electrically connecting the capacitor and the voltage limiting device.

12. The capacitor structure as defined by claim 8, wherein the capacitor structure comprises a MOSCAP or other capacitor structure.

* * * * *